(12) United States Patent
Hsieh

(10) Patent No.: US 7,365,419 B2
(45) Date of Patent: Apr. 29, 2008

(54) SURFACE-MOUNT PACKAGING FOR CHIP

(75) Inventor: Ming-Chih Hsieh, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,540

(22) Filed: Aug. 18, 2006

(65) Prior Publication Data

US 2007/0114652 A1 May 24, 2007

(30) Foreign Application Priority Data

Nov. 18, 2005 (CN) .................. 200510101548.6

(51) Int. Cl.
*H01L 23/544* (2006.01)

(52) U.S. Cl. ...................................... 257/697; 257/797
(58) Field of Classification Search ................ 257/797, 257/697, 693, 798
See application file for complete search history.

(56) References Cited

U.S. PATENT DOCUMENTS 5,909,122 A * 6/1999 Chung et al. ............... 324/758
6,281,695 B1 * 8/2001 Chung et al. ............... 324/758

* cited by examiner

*Primary Examiner*—S. V. Clark
(74) *Attorney, Agent, or Firm*—Wei Te Chung

(57) ABSTRACT

A chip includes a plurality of pins; and a plurality of symbols defined on a surface of the chip, wherein the symbols are arranged as a graduated scale corresponding with the pins. It becomes very easy to find a initial pin from among the plurality of pins of the chip.

13 Claims, 1 Drawing Sheet

SURFACE-MOUNT PACKAGING FOR CHIP

FIELD OF THE INVENTION

The present invention relates to chips, and more particularly to surface-mount packaging for a chip, pins of which are easily identified.

DESCRIPTION OF RELATED ART

Usually, a chip has a lot of pins. Thus, manufacturers should always include some kind of mark or label near the first pin of the chip to facilitate orienting the chip in a correct position for mounting. However, in the design and/or testing process, people often need to count the pins from the first pin to find a specific pin. When the chip has a lot of pins, it will cost much time to find the specific pin and mistakes are easily made.

What is desired, therefore, is a chip, pins of which are easily identified.

SUMMARY OF THE INVENTION

In one preferred embodiment, a chip includes a plurality of pins, and a plurality of symbols defined on a surface of the chip. The symbols are arranged as a graduated scale corresponding with the pins.

Other advantages and novel features will become more apparent from the following detailed description of preferred embodiments when taken in conjunction with the accompanying drawings, in which:

DETAILED DESCRIPTION OF THE INVENTION

Figure 1:
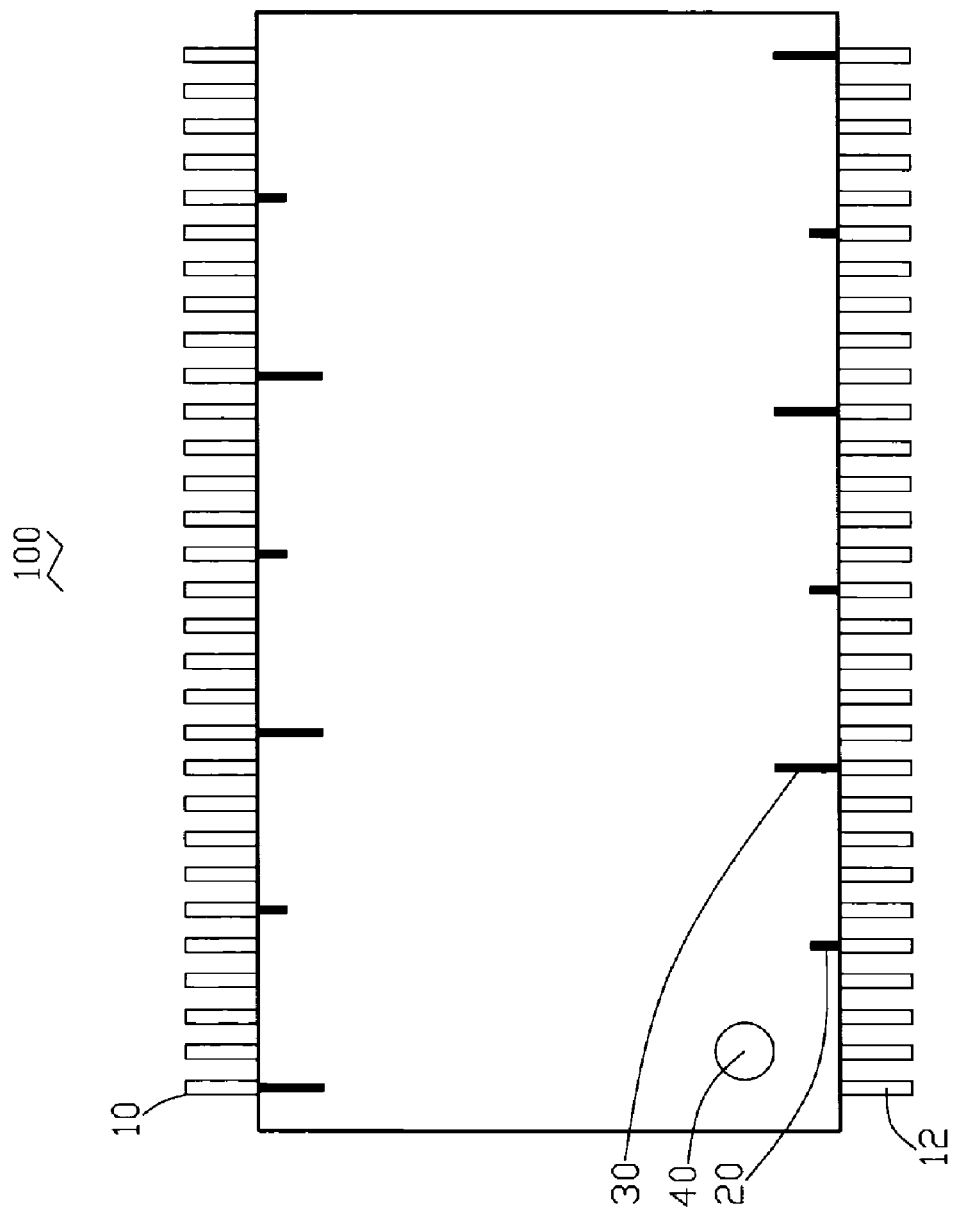
FIG. 1 is a schematic top plan view of a chip, in accordance with a preferred embodiment of the present invention.

As shown in FIG. 1, in a preferred embodiment of the present invention, a chip 100 includes a plurality of pins 10. This embodiment employs a chip having sixty pins as an example. One of the pins 10 is marked as an initial pin 12, for example, employing the first pin of the chip 100 acting as the initial pin 12. A marker 40 is usually made on the chip 100 by chip manufactures to indicate the initial pin 12 for facilitating orienting the chip 100 in a correct position for mounting. A label can also be employed to indicate the initial pin 12.

In a surface of the chip 100, every five of pins 10 is indicated with a first symbol 20 or a second symbol 30. In this embodiment, the first symbol 20 is a short line, and the second symbol 30 is a long line. The first symbol 20 and the second symbol 30 are arranged alternately. For example, the fifth pin counting from the initial pin 12 is signed with the first symbol 20, and the tenth pin counting from the initial pin 12 is signed with the second symbol 20, and so on. That is to say, the first symbols 20 and the second symbols 30 are arranged as a graduated scale corresponding with the pins 10. If a number of one of the pins 10 is a multiple of five but not of ten, the first symbol 20 is assigned thereon. If a number of one of the pins 10 is a multiple of a ten, the second number 30 is signed thereon. The idea can also be expressed as M*Nth pin counting from the initial pin 12 is marked with one of the symbols 20 or the symbols 30, N=1, 2, 3, . . . , n, n is an integer greater than zero, and M is an integer constant. Although in this embodiment, five is used for the increments of the graduated scale other amounts may be selected as desired. Thus, it becomes very easy to identify the initial pin 12 as needed, but other pins as well. Additionally, the first symbols 20 and the second symbols 30 can be markings comprising lines having same length but different colors, or differing symbolic figures, and so on.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A chip comprising:
   a plurality of pins arranged in a plurality of groups; and
   a plurality of symbols defined on a surface of the chip, wherein the symbols are arranged as a graduated dimensional scale with each symbol corresponding to a group of pins.

2. The chip as claimed in claim 1, wherein one of the pins is marked as an initial pin, an M*Nth pin counting from the initial pin is marked with one of the symbols, N=1, 2, 3, . . . , n, n being an integer greater than zero, M is an integer constant.

3. The chip as claimed in claim 2, wherein the M equals five.

4. The chip as claimed in claim 2, wherein one of the symbols marking a 2M*Nth pin counting from the initial pin is different from the other symbols.

5. The heat sink as claimed in claim 4, wherein the one of the symbols marking a 2M*Nth pin is a line longer than the other symbols.

6. A chip comprising:
   a body having a pair of opposing side surfaces and a main surface located between the side surfaces;
   a plurality of groups of pins extending from the side surfaces;
   a plurality of symbols defined in the main surface, each of the symbols corresponding to a group of the pins, wherein the symbols are arranged as a graduated dimensional scale corresponding with each group of pins.

7. The chip as claimed in claim 6, wherein each group comprises a pair of subgroups, the chip further comprises an additional symbol corresponding to each pair of subgroups.

8. The chip as claimed in claim 7, wherein the symbols and the additional symbols are different and alternately arranged on the main surface.

9. The chip as claimed in claim 8, wherein the symbols are longer lines and the additional symbols are shorter lines.

10. A chip comprising:
    a body having a pair of side surfaces and a main surface located between the side surfaces;
    a plurality of groups of pins extending outward from the side surfaces, each group including M pins, M being an integer constant greater than or equal to two;

a plurality of symbols defined in the main surface, each of said symbols aligned with a first pin of said each group of the pins, to indicate the corresponding group, for facilitating finding a certain pin among the plurality of groups of pins.

11. The chip as claimed in claim 10, wherein the plurality of symbols are arranged as a graduated dimensional scale corresponding with the pins.

12. The chip as claimed in claim 10, wherein each group of the pins comprises a pair of subgroups of the pins, the chip further comprises an additional symbol corresponding to each pair of subgroups.

13. The chip as claimed in claim 12, wherein the symbols and the additional symbols are different and alternately arranged on the main surface.

* * * * *